United States Patent
Zhang et al.

(10) Patent No.: US 7,350,171 B2
(45) Date of Patent: Mar. 25, 2008

(54) EFFICIENT STATISTICAL TIMING ANALYSIS OF CIRCUITS

(76) Inventors: Lizheng Zhang, Eagle Heights 932C, Madison, WI (US) 53705; YuHen Hu, 7356 Summit Ridge Rd., Middleton, WI (US) 53562; Chun-ping Chen, 1415 Engineering Dr., Madison, WI (US) 53706-1691

( * ) Notice: Subject to any disclaimer, the term of this patent is extended or adjusted under 35 U.S.C. 154(b) by 289 days.

(21) Appl. No.: 11/282,003

(22) Filed: Nov. 17, 2005

(65) Prior Publication Data

US 2007/0113211 A1  May 17, 2007

(51) Int. Cl.
*G06F 17/50* (2006.01)
*G06F 17/15* (2006.01)
*G06F 17/18* (2006.01)

(52) U.S. Cl. .................. 716/6; 703/2; 703/16
(58) Field of Classification Search .............. 716/6; 703/2, 16
See application file for complete search history.

(56) References Cited

U.S. PATENT DOCUMENTS

| | | | |
|---|---|---|---|
| 4,263,651 A | 4/1981 | Donath et al. |
| 4,425,643 A | 1/1984 | Chapman et al. |
| 4,554,636 A | 11/1985 | Maggi et al. |
| 4,698,760 A | 10/1987 | Lembach et al. |
| 4,791,357 A | 12/1988 | Hyduke |
| 4,827,428 A | 5/1989 | Dunlop et al. |
| 4,907,180 A | 3/1990 | Smith |
| 4,924,430 A | 5/1990 | Zasio et al. |
| 5,095,454 A | 3/1992 | Huang |
| 5,218,551 A | 6/1993 | Agrawal |
| 5,282,148 A | 1/1994 | Poirot et al. |
| 5,355,321 A | 10/1994 | Grodstein et al. |
| 5,365,463 A | 11/1994 | Donath et al. |
| 5,396,435 A | 3/1995 | Ginetti |
| 5,416,718 A | 5/1995 | Yamazaki |

(Continued)

OTHER PUBLICATIONS

Bilgen et al., "Covariance analysis of time delay estimates for strained signals", IEEE Transactions on Signal Processing, vol. 46, No. 10, Oct. 1998, pp. 2589-2600.*

(Continued)

*Primary Examiner*—Phallaka Kik
(74) *Attorney, Agent, or Firm*—Craig A. Fieschko, Esq.; DeWitt Ross & Stevens, S.C.

(57) ABSTRACT

Statistical timing analysis methods for circuits are described which compensate for circuit elements having correlated timing delays with a high degree of computational efficiency. An extended canonical timing model is used to represent each delay element along a circuit path, wherein the model bears information regarding any correlations that each element has to any other elements in the circuit (and/or to any external global factors, e.g., global temperature variations over the circuit, etc.). The model can be represented in a vectorized format which allows enhancement of computational efficiency, wherein the coefficients of the vectors allow an objective measure of element correlation (and wherein the vectors can be "pruned" by dropping insignificant coefficients to further enhance computational efficiency). A decomposition procedure can be used to decompose correlated elements into uncorrelated elements to allow delays to me more easily propagated through the timing diagram representing the circuit. Finally, a bounded approximation for the output of the MAX operator is described which provides a safely conservative approximation regardless of the linearity of the MAX output.

28 Claims, 3 Drawing Sheets

U.S. PATENT DOCUMENTS

| | | |
|---|---|---|
| 5,432,707 A | 7/1995 | Leung |
| 5,475,605 A | 12/1995 | Lin |
| 5,508,937 A | 4/1996 | Abato et al. |
| 5,544,071 A | 8/1996 | Keren et al. |
| 5,557,531 A | 9/1996 | Rostoker et al. |
| 5,600,568 A | 2/1997 | Iwakura et al. |
| 5,636,130 A | 6/1997 | Salem et al. |
| 5,636,372 A | 6/1997 | Hathaway et al. |
| 5,666,290 A | 9/1997 | Li et al. |
| 5,768,130 A | 6/1998 | Lai |
| 5,771,375 A | 6/1998 | Mains |
| 5,819,205 A | 10/1998 | Mani |
| 5,841,672 A | 11/1998 | Spyrou et al. |
| 5,847,966 A | 12/1998 | Uchino et al. |
| 5,850,355 A | 12/1998 | Molnar |
| 5,872,717 A | 2/1999 | Yu |
| 5,883,808 A | 3/1999 | Kawarabayashi |
| 5,901,063 A | 5/1999 | Chang |
| 5,937,190 A | 8/1999 | Gregory et al. |
| 5,944,834 A | 8/1999 | Hathaway |
| 6,014,510 A | 1/2000 | Burks et al. |
| 6,018,623 A | 1/2000 | Chang et al. |
| 6,046,984 A | 4/2000 | Grodstein et al. |
| 6,067,650 A | 5/2000 | Beausang et al. |
| 6,185,723 B1 | 2/2001 | Burks et al. |
| 6,237,127 B1 | 5/2001 | Craven et al. |
| 6,263,478 B1 | 7/2001 | Hahn et al. |
| 6,304,836 B1 | 10/2001 | Krivokapic et al. |
| 6,367,060 B1 | 4/2002 | Cheng et al. |
| 6,430,729 B1 | 8/2002 | Dewey et al. |
| 6,526,543 B1 | 2/2003 | Rosser |
| 6,557,151 B1 | 4/2003 | Donath |
| 6,591,407 B1 | 7/2003 | Kaufman et al. |
| 6,606,729 B2 | 8/2003 | Gross et al. |
| 6,634,014 B1 | 10/2003 | Lindberg et al. |
| 6,651,229 B2 | 11/2003 | Allen et al. |
| 6,658,506 B1 | 12/2003 | Nassif et al. |
| 6,684,375 B2 | 1/2004 | Tsukiyama et al. |
| 6,751,744 B1 | 6/2004 | Allen et al. |
| 6,766,504 B1 | 7/2004 | Rahut et al. |
| 2004/0002844 A1* | 1/2004 | Jess et al. ............ 703/14 |
| 2005/0114098 A1* | 5/2005 | Nagahara ............ 703/2 |
| 2006/0285609 A1* | 12/2006 | Fisher et al. ............ 375/316 |

OTHER PUBLICATIONS

Hedrick et al., "The Covariance Propagation Equation Including Time-Delayed Inputs", IEEE Transactions on Automatic Control, vol. 19, No. 5, Oct. 1974, pp. 587-589.*

Bershad et al., "Time Correlation Statistics of the LMS Adaptive Algorithm Weights", IEEE Transactions on Signal Processing, vol. 33, No. 1, Feb. 1985, pp. 309-312.*

Agarwal et al., "Statistical timing analysis using bounds and selective enumeration," IEEE Transactions on Computer-Aided Design of Integrated Circuits and Systems, vol. 22, No. 9, pp. 1243-1260, Sep. 2003.

Agarwal et al., "Statistical timing analysis for intra-die process variations with spatial correlations," Computer Aided Design, 2003 International Conference on. ICCAD-2003, pp. 900-907, Nov. 2003.

Chang et al., "Statistical timing analysis considering spatial correlations using a single pert-like traversal," ICCAD'03, pp. 621-625, Nov. 2003.

Clark, "The greatest of a finite set of random variables," *Operations Research*, pp. 145-162, Mar. 1961, vol. 9, No. 2.

Devgan et al., "Block-based static timing analysis with uncertainty," ICCAD'03, pp. 607-614, Nov. 2003.

Visweswariah et al., "First-order parameterized block-based statistical timing analysis," TAU'04, Feb. 2004, pp. 331-336.

* cited by examiner

EFFICIENT STATISTICAL TIMING ANALYSIS OF CIRCUITS

FIELD OF THE INVENTION

This document concerns an invention relating generally to statistical timing analysis of integrated circuits.

BACKGROUND OF THE INVENTION

For integrated circuits (e.g., VLSI chips) to work properly, the signals traveling along their gates and interconnects must be properly timed, and several factors are known to cause timing variations. As examples, variations in manufacturing process parameters (such as variations in interconnect diameter, gate quality, etc.) can cause timing parameters to deviate from their designed value. In low-power applications, lower supply voltages can cause increased susceptibility to noise and increased timing variations. Densely integrated elements and non-ideal on-chip power dissipation can cause "hot spots" on a chip, which can also cause excessive timing variations.

A classical approach to timing analysis is to analyze each signal path in a circuit and determine the worst case timing. However, this approach produces timing predictions that are often too pessimistic and grossly conservative. As a result, statistical timing analysis (STA)—which characterizes timing delays as statistical random variables—is often used to obtain more realistic timing predictions. By modeling each individual delay as a random variable, the accumulated delays over each path of the circuit will be represented by a statistical distribution. As a result, circuit designers can design and optimize chips in accordance with acceptable likelihoods rather than worst-case scenarios.

In STA, a circuit is modeled by a directed acyclic graph (DAG) known as a timing graph wherein each delay source—either a logic gate or an interconnect—is represented as a node. Each node connects to other nodes through input and output edges. Nodes and edges are referred to as delay elements. Each node has a node delay, that is, a delay incurred in the corresponding logic gates or interconnect segments. Similarly, each edge has an edge delay, a term of signal arrival time which represents the cumulative timing delays up to and including the node that feeds into the edge. Each edge delay has a path history: the set of node delays through which a signal travels before arriving at this edge. Each delay element is then modeled as a random variable, which is characterized by its probability density function (pdf) and cumulative distribution function (cdf). The purpose of STA is then to estimate the edge delay distribution at the output(s) of a circuit based on (known or assumed) internal node delay distributions.

The three primary approaches to STA are Monte Carlo simulation, path-based STA, and block-based STA. As its name implies, Monte Carlo simulation mechanically computes the statistical distribution of edge delays by analyzing all (or most) possible scenarios for the internal node delays. While this will generally yield an accurate timing distribution, it is computationally extremely time-consuming, and is therefore often impractical to use.

Path-based STA attempts to identify some subset of paths (i.e., series of nodes and edges) whose time constraints are statistically critical. Unfortunately, path-based STA has a computational complexity that grows exponentially with the circuit size, and thus it too is difficult to practically apply to many modern circuits.

Block-based STA, which has largely been developed owing to the shortcomings of Monte Carlo and path-based STA, uses progressive computation: statistical timing analysis is performed block by block in the forward direction in the circuit timing graph without looking back at the path history, by use of only an ADD operation and a MAX operation:

ADD: When an input edge delay X propagates through a node delay Y, the output edge delay will be Z=X+Y.

MAX: When two edge delays X and Y merge in a node, a new edge delay Z=MAX(X,Y) will be formulated before the node delay is added.

Note that the MAX operation can also be modeled as a MIN operation, since MIN(X,Y)=−MAX(−X,−Y). Thus, while a MIN operation can also be relevant in STA analysis, it is often simpler to use only one of the MAX and MIN operators. For sake of simplicity, throughout this document, the MAX operator will be used, with the understanding that the same results can be adapted to the MIN operator.

With the two operators ADD and MAX, the computational complexity of block based STA grows linearly (rather than exponentially) with respect to the circuit size, which generally results in manageable computations. The computations are further accelerated by assuming that all timing variables in a circuits follow the Gaussian (normal) distribution: since a linear combination of normally distributed variables is also normally distributed, the correlation relations between the delays along a circuit path are efficiently preserved.

To illustrate, in the ADD operation ADD(X,Y)=Z, if both input delay elements X and Y are Gaussian random variables, then the delay Z=X+Y will also be a Gaussian random variable whose mean and variance are:

$$\text{Mean: } \mu_Z = \mu_X + \mu_Y \qquad (1)$$

$$\text{Variance: } \sigma_Z^2 = \sigma_X^2 + \sigma_Y^2 + 2\text{cov}(X, Y) \qquad (2)$$

where $\text{cov}(X,Y)=E\{(X-\mu_X)(Y-\mu_Y)\}$ is the covariance between X and Y.

In contrast, in the MAX operation Z=MAX(X,Y), MAX is a nonlinear operator: even if the input delays X and Y are Gaussian random variables, Z will not (usually) have a Gaussian distribution. However, as shown in C. Clark, "The greatest of a finite set of random variables," *Operations Research*, pp. 145-162, March 1961, if X and Y are Gaussian and statistically independent, the first and second moments of the distribution of MAX(X,Y) are defined by:

$$\text{Mean: } \mu_Z = \mu_X \cdot Q + \mu_Y(1-Q) + \theta P \qquad (3)$$

$$\text{Variance: } \sigma_Z^2 = (\mu_X^2 + \sigma_X^2)Q + (\mu_Y^2 + \sigma_Y^2)(1-Q) + (\mu_X + \mu_Y)\theta P - \mu_Z^2 \qquad (4)$$

where $\theta = \sigma_{(X-Y)}$. P and Q are the pdf and cdf of the standard Gaussian distribution evaluated at $\lambda = \mu_{(X-Y)}/\sigma_{(X-Y)}$:

$$P(\lambda) = \frac{1}{\sqrt{2\pi}}\exp\left(-\frac{\lambda^2}{2}\right) \quad Q(\lambda) = \int_{-\infty}^{\lambda} P(x)dx \qquad (5)$$

It is then possible to define a Gaussian approximation for the non-Gaussian Z=MAX(X,Y). In C. Visweswariah, K. Ravindran, and K. Kalafala, "First-order parameterized block-based statistical timing analysis," TAU'04, Feburary 2004, the Z=MAX(X,Y) is approximated by a Gaussian random variable $\tilde{Z}$ which is a linear combination of X, Y, and an additional independent Gaussian random variable $\Delta$:

$$Z = \mathrm{MAX}(X, Y) \approx QX + (1-Q)Y + \Delta = \tilde{Z} \quad (6)$$

where Q is defined in the foregoing Equation (5), and is referred to as "tightness." The purpose of the additional random variable $\Delta$ is to ensure that the first and second moments (the mean and the variance) of $\tilde{Z}$ match those of Z as specified in the foregoing Equations (3) and (4).

In the foregoing Clark reference, it was shown that if W is a Gaussian random variable, then the cross-covariance between W and Z=MAX(X,Y) can be found analytically as:

$$\mathrm{cov}(W,Z) = Q\mathrm{cov}(W,X) + (1-Q)\mathrm{cov}(W,Y) \quad (7)$$

Substituting Equation (6):

$$\mathrm{cov}(W,\tilde{Z}) = Q\mathrm{cov}(W,X) + (1-Q)\mathrm{cov}(W,Y) = \mathrm{cov}(W,Z)$$

Hence, a convenient property of the approximator $\tilde{Z}$ is that the cross-covariance between Z and another timing variable W is preserved when the non-Gaussian Z=MAX(X,Y) is replaced by the Gaussian random variable $\tilde{Z}$. Thus, the use of the Gaussian random variable $\tilde{Z}$ as an approximation to the non-Gaussian Z=MAX(X,Y) allows preservation of linearity.

Unfortunately, one flaw of block-based STA is that its underlying assumption of a simple linear (additive) combination of sequential path delays is often incorrect. The delays of elements in a circuit can be correlated due to various phenomena, two common ones being known as global variations and path reconvergence. Global variations are effects that impact a number of elements simultaneously, such as inter- or intra-die spatial correlations, temperature or supply voltage fluctuations, etc. These generate global correlation between delay elements, wherein all globally correlated elements are simultaneously affected. An example of the effect of global variations is schematically depicted in FIG. 1(a), wherein node delays X, Y, and Z all depend on some influence g.

Path reconvergence occurs where elements share a common element or path along their past path histories owing to path intersections, and this leads to path correlation (local correlation of elements along some section of a path). An example of the effect of path correlation is schematically depicted in FIG. 1(b), wherein edge delays X and Y both depend on node delay p.

The underlying problem of global and path correlation is that while the output of the MAX operator can be directly approximated by a Gaussian distribution having its first two moments matching those of Equations (3) and (4), this approach fails to retain any correlation information after the MAX operation is performed. In short, the MAX operator destroys correlation information which may be critical to accurate timing prediction. Several approaches have been proposed for dealing with global and path correlation, but the field of timing analysis is lacking in methods for accounting for both of these correlations in an accurate and computationally efficient manner.

One approach to compensating for global variations is to use a canonical timing model (C. Visweswariah, K. Ravindran, and K. Kalafala, "First-order parameterized block-based statistical timing analysis," TAU'04, Feburary 2004; A. Agarwal, D. Blaauw, and V. Zolotov, "Statistical timing analysis for intra-die process variations with spatial correlations," Computer Aided Design, 2003 International Conference on. ICCAD-2003, pp. 900-907, November 2003; H. Chang and S. S. Sapatnekar, "Statistical timing analysis considering spatial correlations using a single pert-like traversal," ICCAD'03, pp. 621-625, November 2003). In the canonical timing model, each of the node delays is represented as a summation of three terms:

$$n_i = \mu_i + \alpha_i R_i + \sum_{j=1} \beta_{i,j} G_j \quad (8)$$

where $n_i$ (i=1,2, . . . ) is the random variable corresponding to the ith node delay in the timing graph; $\mu_i$ is the expected value of $n_i$; $R_i$; (called the node variation or local variation), is a zero-mean, unity variance Gaussian random variable representing the localized statistical uncertainties of $n_i$; $G_j$ represents the jth global variation, and is also modeled as a zero-mean, unity variance Gaussian random variable; $\{R_i\}$ and $\{G_j\}$ are additionally assumed to be mutually independent; and the weight parameters $\alpha_i$ (named node sensitivity or local sensitivity) and $\beta_{ij}$ (named global sensitivity) are deterministic constants, explicitly expressing the amount of dependence of $n_i$ on each of the corresponding independent random variables.

With this canonical representation, the variance of a node delay $n_i$ and its correlation (covariance) with another node delay $n_k$ can be evaluated as:

Variance: (9)

$$\sigma_{n_i}^2 = E\{(n_i - \mu_i)^2\} = \alpha_i^2 + \sum_j \beta_{i,j}^2$$

Covariance: (10)

$$\mathrm{cov}(n_i, n_k) = E\{(n_i - \mu_i)(n_k - \mu_k)\} = \sum_j \beta_{i,j} \beta_{k,j}$$

However, if Equation 8 is also used to represent edge delays, this approach will implicitly assume that edge delays will only experience global variations, and that no path reconvergence occurs in the timing graph. This approach is acceptable where no path reconvergence is present, or where global variation dominates the correlations in the timing graph, but it will have severe problems where path correlation is important—which is unfortunately a common situation. To illustrate, in FIG. 1(b), both edge delays X and Y share a common path history including node p. However, in the canonical representation of edge delays X and Y, the local variation $R_p$ of node p is not present: the path correlation between X and Y due to $R_p$ is (incorrectly) dropped.

In the Visweswariah et al. reference, the aforementioned concept of tightness is used to retain global correlation information through the nonlinear MAX operation. A tightness-based linear combination is proposed to approximate the MAX operator while including an independent random variable $\Delta$ for the purpose of matching moments and covariance (Equation (6)). While the purpose of the inclusion of an independent Gaussian random variable $\Delta$ is to ensure the matching of the covariance of $\tilde{Z}$ to the output of the MAX operator Z, this parsimonious random variable may not accurately propagate correlation information, and thus may inadvertently introduce additional modeling error of the output pdf.

In A. Devgan and C. Kashyap, "Block-based static timing analysis with uncertainty," ICCAD'03, pp. 607-614, November 2003, a common node detection procedure is introduced to deal with path correlation (path reconvergence), but here global correlation is neglected. This method assumes that if two edge delays X and Y ever pass a common node whose output edge delay is W, then X=X'+W and Y=Y'+W. Operation MAX(X,Y) is then done as W+MAX (X'+Y'). This approximation is imperfect since X and Y usually don't have a very strong dependence on W. A counter example is illustrated in FIG. 2, where both X and Y are theoretically dependent on W, but practically speaking, X will be independent of W if U>>W, and similarly Y will be independent of W if V>>W.

Given that the trend in circuit fabrication is to ever-increasing speed and ever-decreasing size, there is clearly a pressing need for accurate methods of statistical timing analysis which compensate for both global and path correlation, and which are computationally efficient so that rapid design and testing is feasible.

SUMMARY OF THE INVENTION

The invention, which is defined by the claims set forth at the end of this document, is directed to methods of block-based statistical timing analysis (STA) which can take into account correlations caused by both global variations and path reconvergence, and which can at least partially alleviate the drawbacks of prior STA methods. A basic understanding of some of the preferred features of the invention can be attained from a review of the following brief summary of the invention, with more details being provided in the following section of this document entitled Detailed Description of Preferred Versions of the Invention.

Initially, Section 1 of the Detailed Description section describes how the nonlinear MAX operation can be approximated by a weighted linear mixing operator which performs a linear supposition of its inputs, and which has the moments of its output matched to those of the MAX operation. The preferred form of this operation is $U=\rho X+(1-\rho)Y+\zeta$, wherein X and Y are the inputs and $\rho$ and $\zeta$ are constants chosen such that U has matching moments with Z=MAX (X,Y). Whereas Gaussian inputs to the MAX operator will result in a nonlinear/non-Gaussian output which lacks any information regarding correlation between the inputs, the linear mixing operator proposed here conveniently retains both linearity and correlation information, and it is therefore preferred for use in the steps/methods discussed below.

Section 2 of the Detailed Description then discusses how a modified version of the traditional canonical timing model, referred to herein as the Extended Canonical Timing Model, can be used to represent all delay elements (both nodes and edges) in a circuit as a weighted linear combination of a set of independent random variables, with the weights being capable of representing the effects of both global and local (path) correlation. A preferred form for the weighted linear combination is:

$$X = \mu_X + \sum_{i=1}^{N} \alpha_{X,i} R_i + \sum_{j=1}^{M} \beta_{X,j} G_j$$

wherein: $\mu_x$ is the mean of a Gaussian distribution defining delay element X;
N is the number of signal delays in the circuit;
M is the number of global variations in the circuit;
$R_i$ and $G_j$ are each Gaussian random variables;
$\alpha_{X,i}$ is a node sensitivity reflecting the dependence of X on signal delay i in the circuit; and
$\beta_{X,j}$ is a global sensitivity reflecting the dependence of X on global variation j in the circuit.

Further, this combination can be easily expressed in a vector format, referred to herein as the Variation Vector Timing Model, which can greatly ease computation.

Section 3 of the Detailed Description then discusses how correlated timing elements can be decomposed into independent (uncorrelated) ones, and then used in the extended canonical timing model (and its variation vector equivalent) to further simplify computation. Here, timing elements X and Y having cov(X, Y)≠0 (i.e., correlated elements) can be substituted with equivalent delays X'+W=X and Y'+W=Y, wherein W is such that cov(X, Y)=0. As will be discussed in Section 3, this can greatly simplify MAX operations.

Section 4 of the Detailed Description provides further details how the foregoing steps/methods can be propagated throughout a timing graph (i.e., how the foregoing steps/methods can be used to attain calculated delays throughout a circuit/timing graph).

Section 5 of the Detailed Description then describes a preferred modification of the foregoing steps wherein the variation vector timing model is "pruned" to eliminate coefficients that have minor impact on final results, thereby greatly enhancing computational speed and reducing storage burdens. Rather than dropping these coefficients entirely (which can increase error owing to the cumulative effect of these coefficients), they may be replaced by a correction term which at least partially accounts for their collective impact.

Section 6 of the Detailed Description then reviews experimental results generated during testing of the foregoing steps/methods.

Section 7 then defines a bounded approximation that can be used for the MAX operator in situations where the output of the MAX operation is significantly non-Gaussian, a situation which might arise (for example) where the input delays have significantly different variances. Whereas other approximations can sometimes underestimate the MAX output in this situation (which can lead to risky timing assumptions and possibly excessive circuit failure), the proposed bounded approximation is conservatively defined in such a manner that it will marginally exceed the MAX output, to some desired level of confidence.

Further advantages, features, and objects of the invention will be apparent from the following detailed description of the invention in conjunction with the associated drawings.

DETAILED DESCRIPTION OF PREFERRED VERSIONS OF THE INVENTION

Figure 1A:
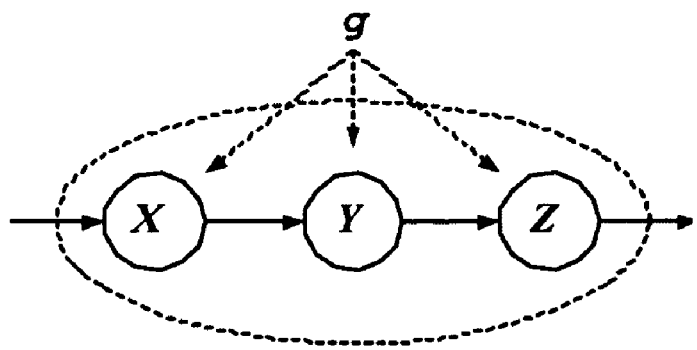
FIG. 1(a) depicts a timing graph schematically depicting the effect of influence g on nodes X, Y, and Z, introducing global correlation of these nodes.
Figure 1B:
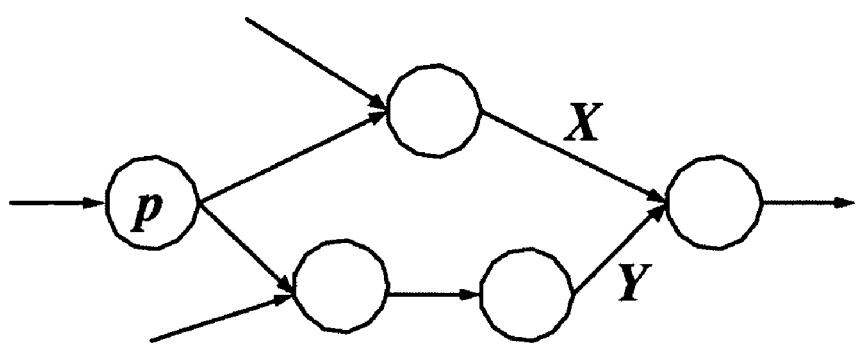
FIG. 1(b) depicts a timing graph schematically depicting the effect of node p on edges X and Y, wherein edges X and Y experience path correlation owing to shared portions of their path histories.
Figure 2:
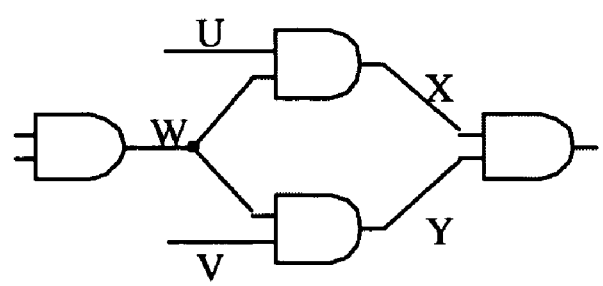
FIG. 2 provides an exemplary series of interconnected gates which pose challenges in accounting for path correlation.

1. Asymptotic Approximation of MAX Operator (Linear Mixing Approximation)

The invention first proposes an approximation for the nonlinear MAX operator by using a weighted linear mixing operator, such that if the inputs to the linear mixing operator have a Gaussian distribution, so will the output after the linear mixing operation. However, the linear mixing operator also preserves the correlation information that is destroyed by the conventional MAX operation, thereby significantly improving the accuracy of the STA. The preferred linear approximation is of the form:

$$U = \rho X + (1-\rho) Y + \zeta \quad (11)$$

wherein $\rho$ is a constant between 0 and 1 ($0<\rho<1$) called the contribution factor, and $\zeta$ is an arbitrary constant, chosen so that where X and Y have a Gaussian distribution and cov(X,Y)=0, the first two moments (mean and variance) of the resulting Gaussian output U match those of Z=MAX(X, Y). This requirement leads to the following two equations:

$$\mu_U = \rho \mu_X + (1-\rho) \mu_Y + \zeta = \mu_Z \quad (12)$$

$$\sigma_U^2 = E\{|U-E\{U\}|^2\} = \rho^2 \sigma_X^2 + (1-\rho)^2 \sigma_Y^2 = \sigma_Z^2 \quad (13)$$

From Equation (12):

$$\zeta = \mu_Z - (\mu_X + \mu_Y)\rho$$

where the contribution factor $\rho$ can be determined from Equation (13) by solving the quadratic equation:

$$(\sigma_X^2 + \sigma_Y^2)\rho^2 - 2\sigma_Y^2 \rho + \sigma_Y^2 - \sigma_Z^2 = 0 \quad (13)$$

Here, the contribution factor p must have at least one real-valued root between 0 and 1. This is met when the following inequality is satisfied:

$$\sigma_Z^2 \geq \frac{\sigma_X^2 \sigma_Y^2}{\sigma_X^2 + \sigma_Y^2} \quad (14)$$

And thus the contribution factor $\rho$ has two real-valued roots that can be expressed as:

$$\rho_{\pm} = \frac{\sigma_Y^2}{\sigma_X^2 + \sigma_Y^2} \pm \sqrt{\left(\frac{\sigma_X^2}{\sigma_X^2 + \sigma_Y^2}\right)^2 + \frac{\sigma_Z^2 - \sigma_X^2}{\sigma_X^2 + \sigma_Y^2}} \quad (15)$$

It can be shown that if $$\sigma_Y^2 \geq \sigma_X^2, \ 0 < \sigma_- < 1$$

and if $$\sigma_Y^2 < \sigma_X^2, \ 0 < \sigma_+ < 1$$

So by switching the contribution factor $\rho$ between $\rho_-$ and $\rho_+$ according to the relative magnitude of $\sigma_X^2$ and $\sigma_y^2$, $0<\rho<1$ can always be guaranteed.

For independent Gaussian random variables X and Y, if the pdf of MAX(X,Y) as estimated from Monte Carlo simulation is compared to its Gaussian approximation from the linear mixing operator, it can be seen that a very close match results. Thus, the linear mixing operator is sufficient to model the results of MAX(X,Y) where X and Y are independent. However, where X and Y are correlated (as from path correlation), error can exist between MAX(X,Y) and its linear mixing approximation (though simulations can verify that it is nonetheless less than that of the tightness-based approach of C. Visweswariah, K. Ravindran, and K. Kalafala, "First-order parameterized block-based statistical timing analysis," TAU'04, Feburary 2004). Nevertheless, as will be discussed later in this document, correlated random variables modeling delay elements in a circuit timing graph can be decomposed into independent delay elements, and the MAX operation on the correlated delay elements can be equated to a MAX on the decomposed independent delay elements followed by an ADD operator. Such decomposition can rely on the variation vector timing model (or extended canonical timing model) discussed below.

2. Variation Vector Timing Model (Extended Canonical Timing Model)

As previously noted, the canonical timing model of Equation (8) only preserves node delay correlations caused by global variation, while neglecting edge delay correlations from path reconvergence. The present invention preferably implements an extended canonical timing model that is capable of representing all the correlation, whether global or path correlation, between any pair of delay elements in a circuit, whether node delays or edge delays. The extended canonical timing model is based on the following principles.

Assume that there are N nodes and M global variations in a timing graph, and that the linear approximation for the MAX operator can be expressed by Equation (11). If every node delay can be modeled by the canonical format of Equation (8), then every delay element—whether a node delay or an edge delay—can then be represented by the following extended canonical timing expression:

$$X = \mu_X + \sum_{i=1}^{N} \alpha_{X,i} R_i + \sum_{j=1}^{M} \beta_{X,j} G_j \quad (16)$$

This can be established using the mathematical induction principle:

(a) Node delays: if X is a node delay, it will automatically have the extended canonical timing format because the original canonical timing Equation (8) is a subset of Equation (16) in that for the kth node delay, only one $\alpha_{X,k}$ has non-zero value while all other $\alpha_{X,j \neq k}$ are set to zero.

(b) ADD operation: X=A+B (e.g., X is the output edge delay resulting from input edge delay A entering node B), and delay elements A, B all fit Equation (16), then X must have the extended canonical timing format.

(c) MAX operation: if X=MAX(A,B) (e.g., where X is the output edge delay resulting from merger of input edge delays A and B), given that delay elements A and B fit Equation (16), then X=MAX(A,B)=ρA+(1−ρ)B+ζ as per Equation (11) if A and B are independent. (If A and B are correlated, they can first be decorrelated as discussed later in this document: here A=A'+W, B=B'+W, cov(A',B')=0, and A', B', and W also each meet Equation (16). Thus, X=MAX(A,B) =MAX(A'+W, B'+W)=W+max(A',B')=W+ρA'+(1−ρ)B'+ζ, and X will still have the extended canonical delay format of Equation (16).)

(d) Edge delays: any edge delay can ultimately be expressed as the result of one or multiple steps of ADD and/or MAX operations from node delays. Thus, based on assertions (a)-(c), the mathematical induction principle ensures that edge delays will also have the extended canonical format of Equation (16).

Thus, with Equation (16), both global and path correlations can be handled uniformly through edges and nodes. More specifically, global variations are represented by the set of global sensitivity terms $\beta_{X,j}$, and dependence on path history (local variations from path reconvergence) are represented by non-zero node sensitivity terms $\alpha_{X,k}$.

For ease of processing, the extended canonical format of Equation (16) can be rewritten in a compacted vector format as $$X = \mu_X + \chi^T b \qquad (17)$$

where $b \equiv [R_1, \ldots R_N, G_1, \ldots G_M]^T$ is a random vector consisting of zero-mean, unity variance independent Gaussian random variables and $\chi \equiv [\alpha_{X,1}, \ldots \alpha_{X,N}, \beta_{X,1}, \ldots \beta_{X,M}]^T$ is a deterministic vector, referred to herein as the Variation Vector (vv) of X. Thus, each delay element (X) in a circuit will be uniquely represented by its mean ($\mu_X$) and variation vector ($\chi$), noted as $$X = X(\mu_X, \chi) \qquad (18)$$

The variation vector can be seen to have the following properties:

(a) If c is a constant, the delay element X and the delay element X+c have the same variation vector x. This property indicates that a variation vector remains unchanged if a constant is added to the corresponding delay element, since the variation vector contains only the variance information of the delay element while the added constant only affects the mean of the delay element.

(b) If delay elements X, Y, and Z can be expressed as Z=X+Y, then their corresponding variation vectors can be expressed as z=x+y. In other words, the variation vectors of delay elements are additive in the same manner as their delay elements.

(c) If the relationship between delay elements X and Z can be expressed as Z=kX, then the relationship between their variation vectors can be expressed as z=kx. In other words, variation vectors are multiplicative in the same manner as their delay elements.

(d) The variance of delay element X can be expressed as $\rho^2_X = \chi^T \cdot \chi = \|\chi\|$.

(e) The covariance of delay elements X and Y can be expressed in terms of their variation vectors as $cov(X,Y) = \chi^T \cdot y = y^T \cdot \chi$.

As will be discussed later, properties (b) and (c) are useful to the concept of variation vector propagation. Properties (d) and (e) make variation vectors an convenient and systematic way to evaluate the variances and correlations for any delay elements.

3. Correlation Decomposition

As discussed previously, if X and Y are independent, the linear mixing operator can be used to obtain an accurate Gaussian approximation of the pdf of MAX(X,Y) (i.e., the linear mixing operator is sufficient to model the results of MAX(X,Y) where X and Y are not correlated, as by the presence of path correlation). Since path correlation is common in VSLI (Very Large Scale Integration) and other modern circuits, there remains a need to determine (or at least approximate) the output of the MAX operation for correlated delay elements X and Y. There are known methods for decomposing correlated (dependent) delay elements into uncorrelated (independent) substitute elements, e.g., the Principal Components Analysis (PCA) method of C. Clark, "The greatest of a finite set of random variables,"*Operations Research*, pp. 145-162, March 1961. Unfortunately, the MAX operation is generally not communicative with linear transformation operators U (i.e., any linear transformation operation U performed on correlated independent variables generally does not result in transformed variables having the same MAX output):

$$MAX \{U(X,Y)\} \neq U\{MAX(X,Y)\}$$

so this approach is of little use in calculating the MAX output for two correlated delay elements.

However, an alternative approach to decomposing correlated delay elements can be developed based on the foregoing extended canonical timing model. As illustrated below, if delay elements X and Y in a circuit are represented in the extended canonical timing model as $X = X(\mu_X, x)$ and $Y = Y(\mu_Y, y)$, and if X and Y are correlated, there will be a third delay element W in the extended canonical timing model with an arbitrary mean of $\mu_W$, with $W = W(\mu_W, W)$, such that cov(X'=X−W, Y'=Y−W)=0. In other words, the correlated X, Y can be decomposed into independent X'=X−W, Y'=Y−W, which allows MAX(X,Y) to be expressed as a function of W and MAX(X', Y').

Figure 3:
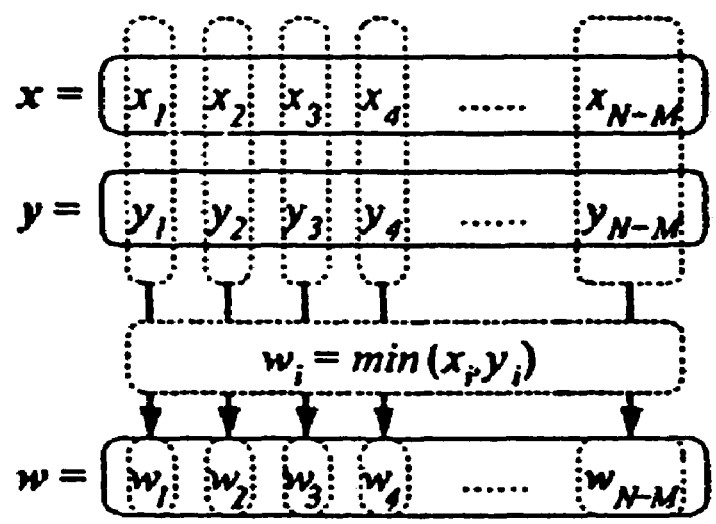
FIG. 3 schematically illustrates a method for constructing a vector w from vectors x and y (which represent delay elements X and Y) wherein w can be used to decompose correlated delay elements X and Y into substitute delay elements which are uncorrelated.

To illustrate, assume that the variation vectors of X and Y are $x = (x_1, x_2, \ldots, x_{N+M})^T$ and $y = (y_1, Y_2, \ldots, y_{N+M})^T$. A new variation vector of $w = (w_1, W_2, \ldots, w_{N+M})^T$ can be constructed as in FIG. 3, wherein $$w_i = MIN(x_i, y_i) \; i = 1, 2, \ldots, N+M \qquad (19)$$

and the MIN operation is token in the sense of absolute value. The constructed variation vector w will completely define a new random variable in the extended canonical timing format as $W = W(\mu_W, w)$, with an arbitrary mean value of $\mu_W$. Further, $cov(X−W, Y−W) = (x−w)^T (y−w) = 0$ since it is impossible for (x−w) and (y−w) to have common non-zero components.

With this method of correlation decomposition, correlated delay elements X and Y are decomposed into independent X', Y'and W by the relations:

$$X = X' + W$$

$$Y = Y' + W$$

$$cov(X',Y') = 0$$

and a valuable feature of the decomposition is that it is communicative with the MAX operation:

$$MAX(X, Y) = MAX(X'+W, Y'+W) = W + MAX(X', Y')$$

Thus, all MAX operations on dependent (correlated) delay elements can be simplified as a MAX operation on independent delay elements followed by an ADD operation.

4. Propagating Mean and Variation Vectors Throughout a Timing Graph

Using the foregoing techniques, the means and variation vectors of the nodes in a timing graph can be propagated through the graph to obtain the means and variation vectors of the edges throughout the entire circuit (graph). As previously noted, all STA operations in a graph can be represented by ADD and MAX operations. With ADD operations, $$Z(\mu_Z, z) = X(\mu_X, x) + Y(\mu_Y, y)$$

and mean and variation propagation is straightforward, and consistent with the foregoing equations (1) and (2):

$$\mu_Z = \mu_X + \mu_Y \qquad (20)$$

$$z = x + y \qquad (21)$$

Figure 4:
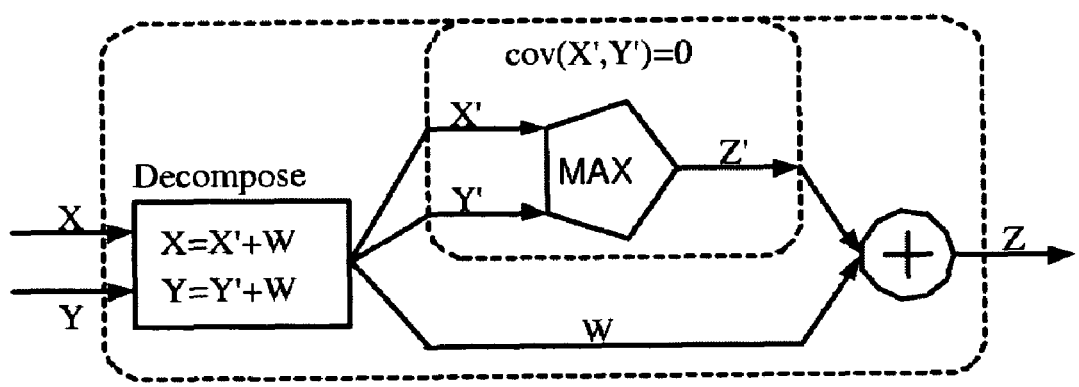
FIG. 4 schematically illustrates a method for decomposing correlated delay elements X and Y into uncorrelated substitute elements X' (=X−W), Y' (=Y−W), and W.

In contrast, the MAX operation:

$$Z(\mu_Z, z) = \text{MAX}\{X(\mu_X, X), Y(\mu_Y, y)\}$$

has more complicated mean and variation vector propagation, at least where X and Y are dependent. Four steps are involved, as schematically depicted in FIG. 4:

(1) Correlation Decomposition:

$$X(\mu_X, x) = X'(\mu_{X'}, x') + W(0, w)$$

$$Y(\mu_Y, y) = Y'(\mu_{Y'}, y') + W(0, w)$$

(note that here the arbitrary $\mu_W$ has been set to zero), and where $$\text{cov}(X', Y') = x'^T \cdot y' = 0$$

(2) Calculate $\mu_{Z'}$ and $\sigma_{Z'}$ for Z'=MAX(X',Y') (from Equations (3) and (4))

(3) Calculate the contribution factor $\rho$ for Z'=MAX(X',Y') (from Equation (11))

(4) Final Results for Z=MAX(X,Y):

$$\mu_Z = \mu_{Z'} + \mu_W = \mu_{Z'} \qquad (22)$$

$$z = \rho x' + (1-\rho) y' + w \qquad (23)$$

The foregoing assumes correlated X and Y, but if X and Y are known to be independent, decomposition is unnecessary and the MAX operation can be simplified by use of the linear mixing approximation discussed earlier.

Occasionally, multiple edges will merge in a node, or other situations may arise where more than two delay elements are involved in the MAX operation. In these circumstances, MAX can be performed iteratively, with MAX being performed on two of the elements at each iteration.

5. Streamlining of Computations: Sparsity Enhancement

Assuming N nodes in a timing graph, each node delay (as well as a corresponding edge delay) will have a N+M dimensional variation vector. Thus, the total computation and storage required will be $O(N(N+M)) \approx O(N^2)$. However, during testing of the foregoing procedures with benchmark circuits, it has been found that many components in the variation vector have very small values, indicating that their contributions to the overall variance is insignificant. Thus, by setting these small coefficients to zero, the variation vector will become a sparse vector containing many zero components, greatly streamlining computations. A preferred method of detecting and eliminating these small components, referred to herein as the flexible vector approach, follows.

The flexible vector approach focuses on curtailing the node sensitivity (also called local sensitivity) portion $\alpha_{X,i}$ of the variation vector (Equation (17)) when the node sensitivity has small values. A drop threshold is defined such that if the node sensitivity is smaller than the drop threshold, the node sensitivity is deemed to have small value, and is preferably placed into a drop candidate pool to be pruned from the variation vector.

However, as is often the case, the resulting computational efficiency is achieved at the price of accuracy: dropping node sensitivities $\alpha_{X,i}$ with small magnitude is the same as applying truncation to the variation vector, and in subsequent computations, the quantization error may accumulate, resulting in non-negligible error (particularly for large circuits). One solution to this problem is to lump the components in the drop candidate pool into a single correction term:

$$\chi_{pool} = \sqrt{\Sigma \chi_{droppedComponents}^2} \qquad (24)$$

When two variation vectors merge through either an ADD or a MAX operation, their pooling components are assumed to be independent. Hence, $$z_{pool}(\text{ADD}) = \sqrt{\chi_{pool}^2 + y_{pool}^2} \qquad (25)$$

$$z_{pool}(\text{MAX}) = \sqrt{\rho^2 \chi_{pool}^2 + (1-\rho)^2 y_{pool}^2} \qquad (26)$$

Using this drop and pool mechanism, what is really dropped during computation is the path correlation. Thus, a good indication of the extent of path correlation in a circuit can be had by simply looking at the length of the variation vector. If a node is not in any statistically critical paths, its variation will be automatically dropped. A node is also dropped if it is in a critical path but is not statistically important in that path. Thus, by looking to the variation vector generated by use of the foregoing methodology, a circuit designer can readily determine which paths and nodes are statistically critical to circuit performance—information which can be of great value in circuit design.

Additionally, if the average length of the node part of the pruned variation vectors for a given drop threshold is then defined as the path correlation length ($\Gamma$), it can be seen that using the foregoing pool-and-drop methodology, the computation complexity is significantly reduced, from $O(N^2)$ down to $O[(\Gamma+M) \cdot N]$ (where $\Gamma$, M<<N).

6. Experimental Results

It is useful to consider experimental results for the foregoing methodology. The methodology was implemented in C/C++ and tested by ISCAS85 benchmark circuits. Before testing, all benchmark circuits were re-mapped into a library which has gates of not, nand2, nand3, nor2, nor3 and xor/xnor. TABLE 1 summarizes the gate count for each test circuit after gate re-mapping:

TABLE 1

| | Name | | | | | | | | |
|---|---|---|---|---|---|---|---|---|---|
| | c432 | c499 | c880 | c1335 | c1908 | c2670 | c3540 | c5315 | c6288 | c7552 |
| Gate Counts | 280 | 373 | 641 | 717 | 1188 | 2004 | 2485 | 3865 | 2704 | 5355 |

All gates in the library were implemented in 0.18 μm technology, and their delays were characterized by Monte Carlo simulation with Cadence tools (Cadence Design Systems, Inc., San Jose, Calif., USA) assuming that all variation sources, whether process variations or operational variations, follow the Gaussian distribution.

For illustration purposes, only three parameter variations were considered global: channel length (L), supply voltage (Vdd) and temperature (T). All other variation sources, specified in the 0.18 μm technology file, were assumed to be localized in the gate being considered. Further, the spatial dependency of the gate delays was not considered for sake of simplicity (though in real life, gate delay parameters are position dependent).

Monte Carlo simulations with 10,000 repetitions were run to determine "ideal results" for each benchmark circuit, against which the present methodology could be compared. Each repetition involved a process of static timing analysis by fixing global and node variations into a set of randomly sampled values. The global variations are sampled once for each repetition, while the node variation for each gate is newly sampled each time the gate is computed.

TABLE 2 summarizes the edge delay distribution parameters at the primary output of each testing circuit from the "ideal" Monte Carlo (MC) STA and three other STA methodologies. The results labeled as Present represent a high accuracy test of the present methodology wherein the drop threshold is set to as small as 1% (i.e., most path correlations are considered), while the results labeled as Canonical represent the traditional canonical timing model (which is equivalent to the present methodology wherein the drop threshold is set to 100%, i.e., only global correlation is considered). For comparison purposes, a fourth STA method (labeled as "No Corr."), wherein no correlation was considered, was also implemented and simulated. The mean and standard variation μ and σ of the distribution are shown in picoseconds. The column $\tau_{97} = \mu + 2\sigma$ shows the delay estimation at a confidence level of 97%.

TABLE 2

| Circuit | STA Method | CPU Time | Delay Distribution (ps) | | |
|---|---|---|---|---|---|
| | | | μ | σ | $\tau_{97}$ |
| c432 | Monte Carlo | 6.449 | 1288.8 | 219.3 | 1727.5 |
| | Present | 0.030 | 1299.0 | 220.4 | 1739.9 |
| | Canonical | 0.010 | 1348.6 | 216.0 | 1780.7 |
| | No Corr. | 0.000 | 1392.6 | 22.3 | 1437.1 |
| c499 | Monte Carlo | 8.182 | 1073.6 | 178.9 | 1431.4 |
| | Present | 0.030 | 1084.8 | 180.5 | 1445.8 |
| | Canonical | 0.010 | 1125.0 | 178.3 | 1482.0 |
| | No Corr. | 0.000 | 1148.6 | 20.5 | 1189.5 |
| c880 | Monte Carlo | 14.83 | 1445.4 | 266.3 | 1977.9 |
| | Present | 0.050 | 1447.6 | 264.9 | 1977.3 |
| | Canonical | 0.010 | 1463.1 | 264.2 | 1911.5 |
| | No Corr. | 0.010 | 1471.6 | 16.5 | 1504.5 |

TABLE 2-continued

| Circuit | STA Method | CPU Time | Delay Distribution (ps) | | |
|---|---|---|---|---|---|
| | | | μ | σ | $\tau_{97}$ |
| c1355 | Monte Carlo | 19.01 | 1445.4 | 251.4 | 1948.3 |
| | Present | 0.071 | 1460.9 | 250.7 | 1962.3 |
| | Canonical | 0.010 | 1529.4 | 249.0 | 2027.4 |
| | No Corr. | 0.000 | 1536.8 | 12.5 | 1561.8 |
| c1908 | Monte Carlo | 35.80 | 1828.2 | 327.3 | 2482.8 |
| | Present | 0.150 | 1841.9 | 328.4 | 2498.6 |
| | Canonical | 0.030 | 1881.7 | 326.5 | 2534.7 |
| | No Corr. | 0.010 | 1895.1 | 27.0 | 1949.2 |
| c2670 | Monte Carlo | 72.16 | 2097.0 | 382.9 | 2862.8 |
| | Present | 0.181 | 2104.4 | 382.9 | 2870.1 |
| | Canonical | 0.050 | 2161.8 | 379.7 | 2921.2 |
| | No Corr. | 0.020 | 2193.1 | 22.0 | 2237.1 |
| c3540 | Monte Carlo | 84.02 | 2747.2 | 498.8 | 3744.8 |
| | Present | 0.240 | 2752.3 | 502.1 | 3756.5 |
| | Canonical | 0.050 | 2850.3 | 500. | 3851.5 |
| | No Corr. | 0.020 | 2859.7 | 23.4 | 2906.5 |
| c5315 | Monte Carlo | 140.8 | 2399.3 | 441.7 | 3282.6 |
| | Present | 0.641 | 2404.8 | 442.2 | 3289.2 |
| | Canonical | 0.080 | 2474.1 | 441.3 | 3356.7 |
| | No Corr. | 0.040 | 2544.8 | 31.7 | 2608.2 |
| c6288 | Monte Carlo | 114.2 | 6740.1 | 1286.8 | 9313.6 |
| | Present | 5.198 | 6775.9 | 1275.1 | 9326.2 |
| | Canonical | 0.070 | 7290.8 | 1273.1 | 9836.9 |
| | No Corr. | 0.030 | 7325.1 | 14.9 | 7355.0 |
| c7552 | Monte Carlo | 203.0 | 1911.7 | 348.7 | 2609.0 |
| | Present | 0.571 | 1916.6 | 353.8 | 2624.2 |
| | Canonical | 0.110 | 1974.3 | 352.5 | 2679.3 |
| | No Corr. | 0.050 | 2027.4 | 26.3 | 2080.1 |

TABLE 2 illustrates that the present methodology requires greater CPU time than the Canonical and No Corr. methods, but orders of magnitude less than Monte Carlo simulation. TABLE 3 then summarizes the accuracy of the various STA methods compared with the Monte Carlo STA method. It is apparent that the No Corr. method, lacking any consideration of correlation, fails to give reasonable variance estimation (which exemplifies the importance of correlations in STA). However, the No Corr. method still has fairly reasonable mean estimation, illustrating that the mean delay is not very sensitive to the correlation. The present method has significantly less error in mean estimation than both the traditional canonical timing model ("Canonical") and the No. Corr. method, illustrating the importance of considering path correlation. Variance estimation error in the present method, while significantly less than the No. Corr. method, is generally (though not always) slightly better than in the traditional canonical timing model. The closeness in variance estimation error between the present and traditional canonical timing models is possibly owing to the fact that the variance in the tested cases is dominated by global variation.

TABLE 3

| | Mean Error (δμ) | | | Variance Error (δσ) | | |
|---|---|---|---|---|---|---|
| Circuit | Present | Canonical | No Corr. | Present | Canonical | No Corr. |
| c432 | 0.79% | 4.64% | 8.05% | 0.50% | 1.50% | 89.80% |
| c499 | 1.04% | 4.82% | 6.99% | 0.89% | 0.34% | 88.50% |
| c880 | 0.15% | 1.22% | 1.81% | 0.53% | 0.79% | 93.80% |
| c1355 | 1.07% | 5.81% | 6.32% | 0.28% | 0.95% | 95.00% |
| c1908 | 0.75% | 2.93% | 3.66% | 0.27% | 0.24% | 91.80% |
| c2670 | 0.35% | 3.09% | 4.58% | 0.00% | 0.84% | 94.30% |
| c3540 | 0.19% | 3.75% | 4.10% | 0.66% | 0.36% | 95.30% |
| c5315 | 0.23% | 3.12% | 6.06% | 0.11% | 0.09% | 92.80% |
| c6288 | 0.53% | 8.17% | 8.68% | 0.65% | 1.06% | 98.80% |
| c7552 | 0.25% | 3.27% | 6.05% | 1.46% | 1.09% | 92.50% |

Thus, in summary, the present method yields mean and variance estimation which is close to that of Monte Carlo simulation, but without the significant runtime penalty carried by Monte Carlo methods. If the accuracy of mean estimation can be relaxed, the drop threshold can be raised in the present method to yield faster runtime performance at the cost of some mean overestimation.

As previously discussed, another benefit of the use of the present methods is that they allow the degree of path correlation in a circuit to be objectively quantified, e.g., in the form of the path correlation length (Γ) (previously defined as the average length of the node part of the pruned variation vectors for a given drop threshold). For the foregoing ISCAS85 benchmark circuits, the path correlation length Γ at drop threshold of 1% is summarized in TABLE 4. This table illustrates that the path correlation length Γ is much smaller than the circuit size, and basically independent of the circuit size since it remains in the range of about 10-20 even when the circuit size changes dramatically. This illustrates how the use of the flexible vector format can help reduce the complexity of the present methods, since the drop threshold can be set to a desired degree of computational complexity for the given circuit size. The only exceptionally high path correlation length among the tested circuits happens with the c6288 circuit, which is known as a 16-bit array multiplier. Here there are large amount of equal delay paths in the circuit, so few node variations can be dropped owing to their equal importance. This results in greater path correlation length.

TABLE 4

| | Name | | | | | | | | | |
|---|---|---|---|---|---|---|---|---|---|---|
| | c432 | c499 | c880 | c1335 | c1908 | c2670 | c3540 | c5315 | c6288 | c7552 |
| Γ | 22.0 | 11.1 | 14.2 | 19.3 | 27.0 | 15.4 | 21.2 | 14.4 | 80.9 | 16.0 |

7. Use of Bounded MAX Approximation for Non-Gaussian Timing Variables

The foregoing discussion assumed that timing variables all have a normally-distributed (Gaussian) distribution. However, in some circuits, non-Gaussian timing variables can exist, usually owing to non-Gaussian gate delays and/or the non-Gaussian output of the traditional MAX operator. One can compensate for non-Gaussian gate delays by approximating them with a Gaussian distribution which conservatively bounds the non-Gaussian variables, but the non-Gaussian MAX output poses greater challenges. If timing variables are significantly non-Gaussian, timing predictions given by both the preferred and prior STA methods previously described can be inaccurate, and risky to rely upon. It is therefore desirable to apply the Gaussian assumption whenever it is valid, and at the same time use a bounded conservative timing prediction whenever the Gaussian assumption is invalid. The following discussion provides a preferred approach to this objective.

Initially, it is useful to again briefly review the traditional MAX operator. As discussed previously, its output is non-linear, such that the MAX of two Gaussian random variables will no longer be Gaussian. If the output of the MAX operation from two Gaussian random variable inputs is plotted, it can be seen that while the Gaussian inputs each have a symmetric pdf, the MAX output is usually asymmetric: if the pdfs of the input X and Y overlap, Z=MAX (X,Y) cannot have any values to the left of the overlap; to the right side of the overlap region, Z will match the PDF of whichever of X and Y has the greater mean; but in the overlap region, there may be areas where X>Y, and conversely, where Y>X. As a result, the pdf of Z in the overlap region is similar to the pdf of whichever of X and Y has the greater mean, except that it is "squeezed" or "compressed" to the right. As a result, the overall pdf of Z=MAX(X,Y) is that it maintains a Gaussian tail at its right side, while its left side is compressed rightwardly to have a shorter tail, resulting in positive skew. Thus, the skewness can be used as a measure of how far the pdf of the MAX output deviates from an ideal Gaussian distribution (i.e., as a measure of its nonlinearity). For Z=MAX(X, Y), the skewness can be defined as:

$$\kappa = \frac{1}{\sigma_Z^3} E\{(Z - \mu_Z)^3\} \quad (27)$$

where $\mu_Z$ and $\sigma_Z$ are the mean and standard deviation of Z.

If one then analyzes the skewness resulting from a variety of X and Y pdfs, it is seen that in many cases, skewness is zero—meaning Z=max(X, Y) is normally distributed, the MAX operator is linear, and the Gaussian assumption is valid. However, skewness is nonzero, and the MAX operator is significantly nonlinear, where X and Y have very similar means but very different variances.

This document previously discussed the use of the tightness-based MAX approximation of Equation (6) (with tightness being defined in Equation (5)), and the contribution-factor based MAX approximation of Equation (11) (with the contribution factor being defined in Equation (15)). If the results of these equations are compared with the results of Monte Carlo simulation, it can be seen that when the non-linearity of the MAX operation grows significant (i.e., when the output of MAX operator is significantly non-Gaussian)—i.e., where skewness grows—error grows at higher confidence levels, and these approximations begin to underestimate the delays. In contrast to overestimated delays, which lead to conservatively safe circuit designs, the underestimated delays could lead to excessive design failures. Thus, modified versions of the foregoing MAX linear approximations have been developed to compensate for this potential difficulty.

It is first useful to note that for any random variables X, Y, and R=X−Y, the following transformation will always be true:

$$\text{MAX}(X, Y) = \text{MAX}(X-Y, 0) + Y = \text{MAX}(R, 0) + Y \quad (28)$$

When we then consider the MAX approximations of Equations (6) and (11)—here Equation (6) will be used for sake of illustration:

$$Z = \text{MAX}(X, Y) \approx QX + (1-Q)Y + \Delta = \tilde{Z}$$

then MAX(R, 0) can be reexpressed as:

$$W = \text{MAX}(R, 0) \approx QR + (1-Q) \cdot 0 + \Delta = QR + \Delta = \tilde{W}$$

This observation is important because it can be shown that the cdf of $\tilde{W} = QR + \Delta$ will effectively serve as an upper bound on the cdf of W=MAX(R, 0). (The formal proof will not be presented here, but this can be established experimentally by simulation results as well.) Thus, $\tilde{W} = QR + \Delta$ can serve as a conservative approximation for W=MAX(R, 0). To avoid being too conservative, this approximation can be constrained to apply within a certain confidence interval of [a, b] as:

$$W = \text{MAX}(R,0) \leq QR + \Delta = \tilde{W} \ (a \leq R \leq b) \quad (29)$$

Agarwal et al. (in A. Agarwal, V. Zolotov, and D. Blaauw, "Statistical timing analysis using bounds and selective enumeration," IEEE Transactions on Computer-Aided Design of Integrated Circuits and Systems, vol. 22, no. 9, pp. 1243-1260, September 2003) describe a distribution which, if applied here, would effectively amount to MAX(R, 0) being bounded within an interval with 100% confidence. Since this may be more conservative than necessary, the approach of Equation (28) can be useful since a user can flexibly decide the acceptable amount of risk involved.

If the mean of $\Delta$ is then defined as:

$$E\{\Delta\} = \begin{cases} -aQ & (a < b < 0) \\ b(1-Q) & (0 < a < b) \\ \text{MAX}(-aQ, b-bQ) & (a \leq 0 \leq b) \end{cases} \quad (30)$$

this provides a conservative upper bound of MAX(R, 0) over the confidence interval of [a, b] with the form of $QR + \Delta$. In other words, if the confidence interval [a, b] for R corresponds to a confidence of (for example) 97%, then the use of $QR + \Delta$ as an approximation for MAX(R,0) will yield values which have a probability of at least 97% of overestimating the true value of MAX(R,0). The use of this approximation is thus conservative (and safe). Note that while this approximation was derived using the tightness-based MAX approximation of Equation (6), a similar approximation can be derived by use of the contribution-factor based MAX approximation of Equation (11).

While the foregoing approach will result in a safely conservative approximation, it will possibly be too conservative when the MAX output is almost linear (Gaussian) distribution. As noted previously, when the MAX operation is highly linear, the approach of Equations (6) (and/or (11)) is sufficient and there is no need for a bounded conservative approximation. Thus, the foregoing approach can be used to complement the approach of Equation (6) (or (11)): when skewness is low and MAX is linear (or nearly so), the bounded approximation is overly conservative and Equation (6) (or (11)) can be used; and when skewness is high, the approach of Equation (6) (or (11)) is risky and the bounded approximation can be used.

Figure 5:
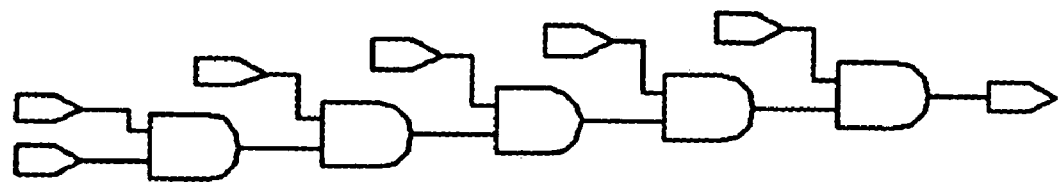
FIG. 5 illustrates an exemplary circuit having a highly nonlinear (non-Gaussian) output owing to the cascaded gates (and a corresponding string of MAX operations, with each receiving the output of the prior operation).

This approach has been experimentally tested for the circuit depicted in FIG. 5, where the overall delay and all internal arrival time variables are significantly non-Gaussian (with the skewness of the output distribution being 2.2). TABLE 5 presents the predicted delay at the 97% confidence interval, $\tau_{97}$, using Equation (6), the foregoing bounded approximation, and Monte Carlo simulation.

TABLE 5

|  | Equation (6) | Bounded Approximation | Monte Carlo |
|---|---|---|---|
| Skewness κ |  | 2.2 |  |
| $\tau_{97}$ | 419.4 ps | 455.5 ps | 450.3 ps |
| μ | 379.1 ps | 399.6 ps | 379.8 ps |
| σ | 20.2 ps | 27.8 ps | 26.4 ps |

Equation (6) significantly underestimates the $\tau_{97}$, which is important because this underestimation, if relied upon, could lead to excessive design failure. On the other hand, the foregoing bounded approximation leads to a 97% delay which is slightly higher (and thus more conservative and safer than) the Monte Carlo "standard." Thus, in cases where the Gaussian assumption is bad (skewness is high), the bounded approximation provides superior results. Further, while not reflected in TABLE 5, the computation time for the bounded approximation is only negligibly greater than that for Equation (6) since Equations (27) and (30) bear minimal additional computation overhead.

The invention is not intended to be limited to the preferred methods and steps described above, but rather is intended to be limited only by the claims set out below. Thus, the invention encompasses all different versions that fall literally or equivalently within the scope of these claims. It should also be understood that in these claims, where symbols and formulae are expressed, the claims are not to be interpreted as meaning that the invention is limited to these symbols and formulae. Rather, the claims extend to processes utilizing the relations set forth by the formulae, regardless of whether the same characters/symbology are used, and regardless of whether the formulae are expressed in the form set forth in the claims or in a different format.

What is claimed is:

1. A method for predicting a signal delay in a circuit having circuit paths formed by elements connected by interconnects wherein:
   (1) at least some of the circuit paths intersect,
   (2) each element and interconnect have an associated signal delay,
   (3) at least one set of correlated signal delays is present, wherein at least one of the signal delays X therein is correlated with at least one of the other signal delay Y therein such that covariance cov(X, Y) is nonzero,
   (4) one or more sets of correlated signal delays arises from global correlation, wherein the signal delays therein are all dependent on global variations;
   the method comprising the steps of:
   a. modeling each signal delay X by:

$$X = \mu_X + \sum_{i=1}^{N} \alpha_{X,i} R_i + \sum_{j=1}^{M} \beta_{X,j} G_j$$

wherein:
   $\mu_X$ is a mean of a distribution defining X;
   N is a number of signal delays in the circuit;
   M is a number of global variations in the circuit;

$R_i$ and $G_j$ are each Gaussian random variables;

$\alpha_{X,i}$ is a node sensitivity reflecting a dependence of X on signal delay i in the circuit;

$\beta_{X,j}$ is a global sensitivity reflecting a dependence of X on global variation j in the circuit; and b. subsequently propagating the modeled signal delays throughout at least one of the circuit paths.

2. The method of claim 1 further comprising the steps of:

c. modeling at least a portion of each signal delay as a vector, and d. reassigning zero values to $\alpha_{X,i}$ which have values below a predetermined drop threshold, thereby simplifying the vector.

3. The method of claim 1 wherein $\alpha_{X,i}$ which have values below a predetermined drop threshold are assigned different values.

4. The method of claim 1 further comprising a step of substituting, for each pair of signal delays X and Y which are correlated such that cov(X, Y) is nonzero, equivalent uncorrelated signal delays $X'+W=X$ and $Y'+W=Y$, wherein W is such that cov(X', Y')=0.

5. The method of claim 1 wherein the step of propagating the signal delays throughout at least one of the circuit paths includes a step of representing the signal delay at a path intersection by an output of a function wherein:

a. the function is dependent on the signal delays of the intersecting circuit paths;

b. a distribution of the output is Gaussian if the distribution of the signal delays of the intersecting circuit paths are Gaussian; and c. the output approximates a maximum of the signal delays of the intersecting circuit paths.

6. The method of claim 5 wherein the function is linearly dependent on the signal delays of the intersecting circuit paths.

7. The method of claim 1 wherein the step of propagating the signal delays throughout at least one of the circuit paths includes a step of representing the signal delay at a path intersection by an output of a function wherein:

a. the output of the function at least closely approximates Z=MAX(X,Y) if skewness of Z is below a predetermined threshold; and b. the output of the function is equal to an upper bound set in excess of Z=MAX(X,Y) if the skewness of Z is above the predetermined threshold.

8. A method for predicting a signal delay in a circuit having circuit paths formed by elements connected by interconnects wherein:

(1) at least some of the circuit paths intersect, (2) each element and interconnect have an associated signal delay, and (3) at least one of the signal delays X is correlated with at least one of the other signal delays Y such that covariance cov(X, Y) is nonzero, the method comprising:

a. for each pair of signal delays X and Y which are correlated, substituting equivalent uncorrelated signal delays $X'+W=X$ and $Y'+W=Y$, wherein W is such that cov(X', Y')=0;

b. subsequently propagating the signal delays throughout at least one of the circuit paths.

9. The method of claim 8 wherein the step of propagating the signal delays throughout at least one of the circuit paths includes a step of representing the signal delay at a path intersection by an output of a function wherein:

a. the function is dependent on the signal delays of the intersecting circuit paths;

b. a distribution of the output is Gaussian if a distribution of the signal delays of the intersecting circuit paths are Gaussian; and c. the output at least approximates a maximum of the signal delays of the intersecting circuit paths.

10. The method of claim 9 wherein the function is linearly dependent on the signal delays of the intersecting circuit paths.

11. The method of claim 9 wherein the output is equal to an upper bound set in excess of the maximum of the signal delays of the intersecting circuit paths if the maximum of the signal delays is significantly non-Gaussian.

12. The method of claim 8 wherein the step of propagating the signal delays throughout at least one of the circuit paths includes a step of representing the signal delay at a path intersection by an output of a function wherein:

a. the function is linearly dependent on the signal delays of the intersecting circuit paths;

b. the output approximates a maximum of the signal delays of the intersecting circuit paths.

13. The method of claim 8 further comprising a step of propagating the signal delays throughout all of the circuit paths.

14. The method of claim 13 further comprising a step of identifying the circuit path with a longest signal delay.

15. The method of claim 8 wherein each signal delay is represented in a form:

$$X = \mu_X + \sum_{i=1}^{N} \alpha_{X,i} R_i + \sum_{j=1}^{M} \beta_{X,j} G_j$$

wherein:

$\mu_X$ is a mean of a distribution defining X;

N is a number of signal delays in the circuit;

M is a number of global variations in the circuit;

$R_i$ and $G_j$ are each Gaussian random variables;

$\alpha_{X,i}$ is a node sensitivity reflecting a dependence of X on signal delay i in the circuit;

$\beta_{X,j}$ is a global sensitivity reflecting the dependence of X on global variation j in the circuit.

16. The method of claim 15 further comprising steps of:

c. modeling at least a portion of each signal delay as a vector, and d. reassigning different values to $\alpha_{X,i}$ which have values below a predetermined drop threshold.

17. A method for predicting a signal delay in a circuit having circuit paths formed by elements connected by interconnects wherein:

(1) at least some of the circuit paths intersect, (2) each element and interconnect have an associated signal delay, and (3) at least one of the signal delays is correlated with at least one of the other signal delays, the method comprising:
a. defining a function representing the signal delay at a path intersection wherein:
   (1) the function is linearly dependent on the signal delays of the intersecting circuit paths; and
   (2) an output of the function is at least substantially equivalent to a maximum of the signal delays of the intersecting circuit paths if variances of the signal delays of the intersecting circuit paths are substantially similar; and
   (3) the output of the function is at least substantially equivalent to an upper bound in excess of the maximum of the signal delays of the intersecting circuit paths if the variances of the signal delays of the intersecting circuit paths are substantially different;
b. determining the output of the function for at least one of the path intersections in the circuit, thereby defining the signal delay for the path intersection.

18. The method of claim 17 further comprising a step of defining the signal delay for at least one portion of a circuit path prior to a path intersection, this signal delay being defined by cumulative signal delays of all prior elements and interconnects along the path.

19. The method of claim 17 further comprising a step of substituting, for each pair of correlated signal delays X and Y, equivalent uncorrelated signal delays:

$$X'+W=X \text{ and}$$

$$Y'+W=Y,$$

wherein W is such that covariance cov(X', Y')=0.

20. The method of claim 17 further comprising a step of propagating the signal delays throughout all of the circuit paths.

21. The method of claim 20 further comprising a step of identifying the circuit path with a longest signal delay.

22. The method of claim 17 wherein each signal delay is represented in a form:

$$X = \mu_X + \sum_{i=1}^{N} \alpha_{X,i} R_i + \sum_{j=1}^{M} \beta_{X,j} G_j$$

wherein:
   $\mu_X$ is a mean of a distribution defining X;
   N is a number of signal delays in the circuit;
   M is a number of global variations in the circuit;
   $R_i$ and $G_j$ are each Gaussian random variables;
   $\alpha_{X,i}$ is a node sensitivity reflecting a dependence of X on signal delay i in the circuit;
   $\beta_{Xj}$ is a global sensitivity reflecting a dependence of X on global variation j in the circuit.

23. The method of claim 22 further comprising steps of:
c. modeling at least a portion of each signal delay as a vector, and
d. reassigning different values to $\alpha_{X,i}$ which have values below a predetermined drop threshold.

24. A method for predicting a signal delay in a circuit having circuit paths formed by elements connected by interconnects wherein:
   (1) at least some of the circuit paths intersect,
   (2) each element and interconnect have an associated signal delay, and
   (3) at least one of the signal delays is correlated with at least one other signal delay,
the method comprising:
a. decomposing at least some of the correlated signal delays into an equivalent collection of uncorrelated signal delays;
b. representing the signal delay at any portion of a circuit path prior to a path intersection by cumulative signal delays of all prior elements and interconnects along the path; and
c. representing the signal delay at a path intersection by an output of a function wherein:
   (1) the function is dependent on the signal delays of the intersecting circuit paths;
   (2) a distribution of the output is Gaussian if a distribution of the signal delays of the intersecting circuit paths are Gaussian; and
   (3) the output approximates a maximum of the signal delays of the intersecting circuit paths.

25. The method of claim 24 wherein the function is linearly dependent on the signal delays of the intersecting circuit paths.

26. The method of claim 24 wherein a step of decomposing at least some of the correlated signal delays into an equivalent collection of uncorrelated signal delays includes the step of substituting, for each pair of correlated signal delays X and Y, equivalent uncorrelated signal delays X'+W and Y'+W, wherein W is such that covariance cov(X', Y')=0.

27. The method of claim 24 wherein at least some of the signal delays are each represented in a form:

$$X = \mu_X + \sum_{i=1}^{N} \alpha_{X,i} R_i + \sum_{j=1}^{M} \beta_{X,j} G_j$$

wherein:
   $\mu_X$ is a mean of a distribution defining X;
   N is a number of signal delays in the circuit;
   M is a number of global variations in the circuit;
   $R_i$ and $G_j$ are each Gaussian random variables;
   $\alpha_{X,i}$ is a node sensitivity reflecting a dependence of X on signal delay i in the circuit;
   $\beta_{Xj}$ is a global sensitivity reflecting a dependence of X on global variation j in the circuit.

28. The method of claim 27 further comprising steps of:
d. constructing vectors representing at least some of the signal delays; and
e. reassigning different values to $\alpha_{X,i}$ which have values below a predetermined drop threshold.

* * * * *